(12) United States Patent
Ryu

(10) Patent No.: US 7,573,769 B2
(45) Date of Patent: Aug. 11, 2009

(54) ENABLE SIGNAL GENERATOR COUNTERACTING DELAY VARIATIONS FOR PRODUCING A CONSTANT SENSE AMPLIFIER ENABLE SIGNAL AND METHODS THEREOF

(75) Inventor: Hoon Ryu, Cary, NC (US)

(73) Assignee: Qimonda North America Corp., Cary, NC (US)

( * ) Notice: Subject to any disclaimer, the term of this patent is extended or adjusted under 35 U.S.C. 154(b) by 76 days.

(21) Appl. No.: 11/968,969

(22) Filed: Jan. 3, 2008

(65) Prior Publication Data
US 2009/0175086 A1 Jul. 9, 2009

(51) Int. Cl.
*G11C 11/4091* (2006.01)
(52) U.S. Cl. ............... 365/212; 365/233.5; 365/208; 365/194; 365/196; 365/195; 365/190; 327/288; 327/285; 327/281; 327/278
(58) Field of Classification Search ............ 365/194, 365/196, 195, 191, 190, 208, 207, 212, 233.5; 327/161, 141, 281, 278, 276, 288, 285
See application file for complete search history.

(56) References Cited

U.S. PATENT DOCUMENTS

| | | | | |
|---|---|---|---|---|
| 4,692,637 A | * | 9/1987 | Shoji | 326/94 |
| 6,498,512 B2 | * | 12/2002 | Simon et al. | 326/93 |
| 7,084,476 B2 | * | 8/2006 | Gupta et al. | 257/499 |
| 2002/0118036 A1 | * | 8/2002 | Simon et al. | 326/29 |

* cited by examiner

*Primary Examiner*—Andrew Q Tran
(74) *Attorney, Agent, or Firm*—Coats & Bennett, P.L.L.C.

(57) ABSTRACT

A sense amplifier enable signal generator has two stages. Each stage offsets transistor performance variation in the other stage to produce an enable signal output relatively immune from the effects associated with transistor mismatches. In one embodiment, a memory device comprises a plurality of memory cells, sense amplifier circuitry and the enable signal generator. The sense amplifier circuitry is coupled to one or more of the memory cells and senses the state of the one or more memory cells when enabled. The enable signal generator has first and second stages and generates an enable signal applied to the sense amplifier circuitry. The enable signal generator counteracts delay variation when generating the enable signal so that operation of the enable signal generator is substantially unaffected by transistor performance variation in either stage of the enable signal generator.

22 Claims, 4 Drawing Sheets

ENABLE SIGNAL GENERATOR COUNTERACTING DELAY VARIATIONS FOR PRODUCING A CONSTANT SENSE AMPLIFIER ENABLE SIGNAL AND METHODS THEREOF

BACKGROUND OF THE INVENTION

Many types of memory devices such as Dynamic Random Access Memory (DRAM) devices store information in memory cells arranged as an array of selectable rows and columns. Lines connecting each row are commonly referred to as word lines. Each column typically comprises two bit lines, each bit line connected to every other memory cell in the column. Data is read from the array by activating the word line containing the desired memory cell. Data stored by each memory cell coupled to the activated word line is transferred to sense amplifier circuitry via the bit lines for amplification. The column containing the desired memory cell is then activated, and the amplified data read out of the array onto a local data bus. The data is then read off chip.

A DRAM read operation occurs in several stages. At the beginning of a read operation, the sense amplifier circuitry is disabled and the bit lines are pre-charged to a matching intermediary voltage level. Bit line pre-charging is then disabled. Next, the storage capacitor of the desired memory cell is coupled to its bit line by activating the word line that actuates the memory cell's access transistor. The other bit lines in each column remain at their pre-charged level. Each selected storage capacitor shares charge with its bit line, slightly altering the pre-charged bit line voltage levels.

After a predetermined amount of time, referred to herein as the bit line signal development time, the sense amplifier circuitry is enabled. The bit line signal development time is the amount of time a storage capacitor should be coupled to a bit line before the sense amplifier circuitry is enabled. The sense amplifier circuitry amplifies the small voltage difference between the selected bit line and the adjacent bit line until one bit line is driven to a logic low level and the other bit line is driven to a logic high level. If the sense amplifier circuitry is too soon, the selected storage capacitor may not have sufficient time to charge its bit line to a voltage level sufficient for sensing. The desired column can be read after sensing is complete. The storage capacitor, which is still connected to the selected bit line because its word line remains active, is also driven to a full voltage level (refreshed) by the action of the sense amplifier circuitry.

Bit line signal development time is dominated by the RC delay of the longest bit line. As such, variation in transistor performance, e.g., as caused by transistor mismatches (i.e., p-fet devices that are stronger or weaker than their complimentary n-fet devices), has only a negligible affect at best on the time needed for bit line signal levels to sufficiently develop prior to sensing. However, operation of bit line sense amplifier circuitry is conventionally controlled by an enable signal generator that is highly sensitive to variation in transistor performance. Conventional enable signal generators activate an enable signal applied to bit line sense amplifier circuitry after a delay lapses during a read or refresh operation. While the delay is selected to provide sufficient bit line signal development time, the delay is a function of transistor performance. As such, the point at which bit line sense amplifier circuitry is enabled conventionally varies as a function of transistor performance, particularly in the enable signal generator.

One conventional enable signal generator includes a chain of inverters. Another conventional enable signal generator includes an inverter driven by a single constant-current source where the inverter output switches logic states some time after the constant-current source is coupled to the inverter input. In either case, the delay allocated to allow bit line signal levels to develop before sensing is a function of transistor performance. While the constant-current source implementation described above is less affected by transistor mismatches, the speed of the inverter output stage is nonetheless remains function of transistor matching. By some estimates, the time allocated for bit line signal level development can vary as high as 87% across a wide process window even though bit line signal development time is predominantly a function of RC delay. As such, bit line sensing operations in conventional memory devices become problematic when the devices contain transistors that are not well matched.

SUMMARY OF THE INVENTION

According to the embodiments described herein, an enable signal generator has two stages. Each stage offsets transistor performance variation in the other stage to produce an enable signal output relatively immune from the effects associated with transistor mismatches. The output signal of the enable signal generator can be used to enable any type of circuitry such as, e.g., bias circuitry, clock signal generators, encoders, decoders, sense amplifier circuitry included in memory devices, or any other type of circuitry having an enable signal input.

In one embodiment, a memory device comprises a plurality of memory cells, sense amplifier circuitry and the enable signal generator. The sense amplifier circuitry is coupled to one or more of the memory cells and is configured to sense the state of the one or more memory cells when enabled. The enable signal generator has first and second stages and is configured to generate an enable signal applied to the sense amplifier circuitry. The enable signal generator is also configured to counteract delay variation when generating the enable signal so that operation of the enable signal generator is substantially unaffected by transistor performance variation in either stage of the enable signal generator.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
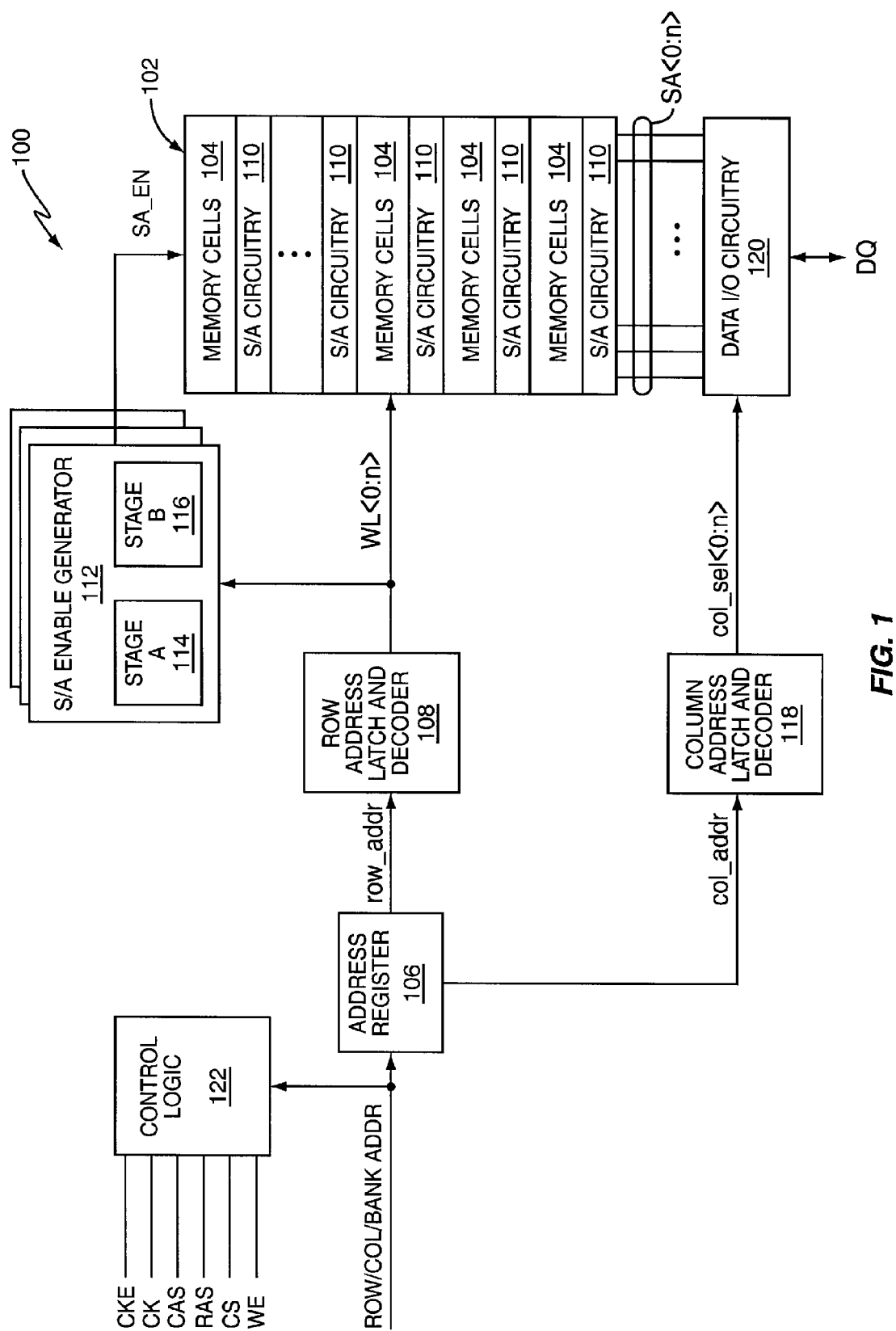
FIG. 1 is a block diagram of an embodiment of a memory device including bit line sense amplifier circuitry and a signal generator for enabling the sense amplifier circuitry.

FIG. 1 illustrates an embodiment of a memory device 100 including a memory array 102. The memory array 102 is arranged as one or more logical banks of memory cells 104 such as Dynamic RAM (DRAM), Ferroelectric RAM (FRAM), Magnetoresistive RAM (MRAM), Phase-change RAM (PRAM) or similar types of cells. Row, column and bank address information (ROW/COL/BANK ADDR) received by the memory device 100 is stored in an address register 106. The address information indicates which row and column location in the memory array 102 is to be accessed during memory operations (and bank if the memory array is so arranged).

Row address latch and decoder circuitry 108 generates a word line select signal (WL<0:n>) based on row address information (row_addr) provided by the address register 106. The word line select signal activates a particular row in the memory array 102, coupling the memory cells 104 in the activated row to their respective bit lines. The signal levels present on the bit lines are sensed and amplified by bit line sense amplifier circuitry 110 when enabled during read and refresh memory operations.

An enable signal generator 112 controls when the sense amplifier circuitry 110 is enabled. The enable signal generator 112 activates an enable signal (SA_EN) applied to the sense amplifier circuitry 110 to initiate bit line sensing. The enable signal generator 112 comprises two stages 114, 116. Each stage 114, 116 offsets transistor performance variation in the other to produce an enable signal output relatively immune from the effects associated with transistor mismatches.

That is, if one stage 114, 116 of the enable signal generator 112 is faster or slower than expected, e.g., due to transistor mismatches, the other stage counteracts the performance variation such that both stages 114, 116 in combination provide a relatively constant overall delay. This way, the delay incurred by the sense amplifier circuitry 110 before being enabled during a read or refresh operation remains substantially fixed despite transistor performance variation in either stage 114, 116 of the enable signal generator 112. Accordingly, the total delay associated with the enable signal generator 112 can be readily selected to satisfy the signal development time of the memory device 100 for a wide range of transistor process variations.

After the bit lines have been sensed, column address latch and decoder circuitry 118 generates a column select signal (col_sel) based on column address information (col_addr) provided by the address register 106. The column select signal activates data I/O circuitry 120 included in the memory device 100. In response to the column select signal, the data I/O circuitry 120 selects one or more sense amplifier outputs (SA<0:n>) and couples the selected outputs to a data bus (DQ). The desired data may then be read off-chip.

In more detail, the memory device 100 also includes control logic 122 for managing overall memory device operation responsive to received signals such as a clock enable (CKE), clock (CK), chip select (CS), write enable (WE), row address strobe (RAS), column address strobe (CAS) and address signals (ROW/COL/BANK ADDR), as is well known in the art. The control logic 122 determines the type of memory operation to be performed and when based on the state of the received signals.

Figure 2:
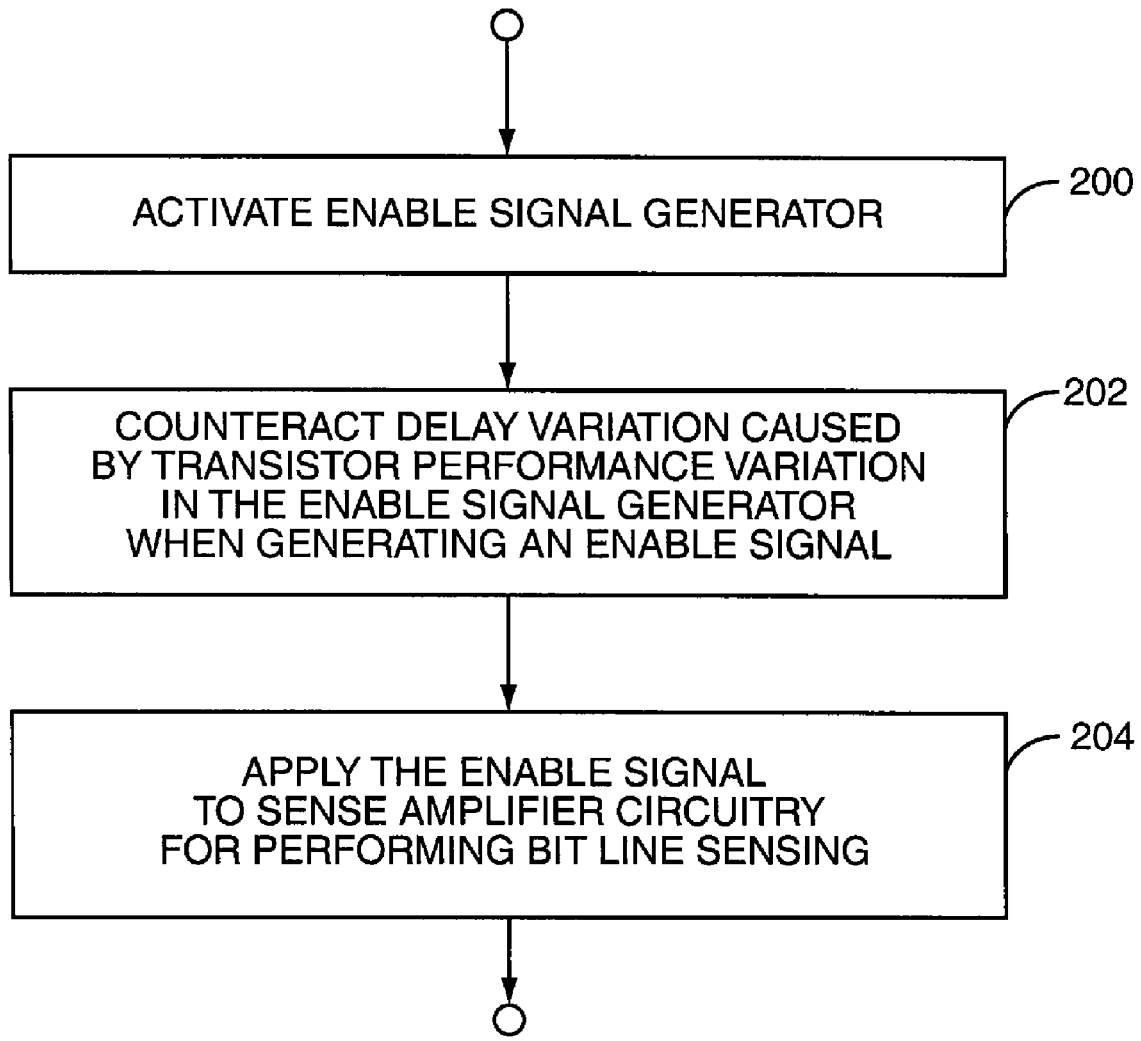
FIG. 2 is a logic flow diagram of an embodiment of program logic for enabling the bit line sense amplifier circuitry of FIG. 1.

When the control logic 122 initiates a read or refresh operation, the address register 106 is directed to provide the current row address to the row address latch and decoder circuitry 108. In turn, the word line activated by the row address latch and decoder circuitry 108 selects the corresponding row of memory cells 104 in the memory array 102. The activated word line also triggers operation of the enable signal generator 112, e.g., as illustrated by Step 200 of FIG. 2. The enable signal generator 112 subsequently enables the sense amplifier circuitry 110 for sensing the array bit lines after a total delay associated with both stages 114, 116 of the generator 112 lapses. The enable delay ensures that the bit line signal development time associated with the memory array 102 is satisfied before bit line sensing commences.

Particularly, activation of a word line triggers operation of the first enable signal generator stage 114. The output of the first stage 114 activates in response to a first delay lapsing after word line activation. This in turn triggers operation of the second enable signal generator stage 116. The output of the second stage 116 activates in response to a second delay lapsing after the output of the first stage 114 activates. The enable signal generator 112 counteracts variation in either delay so that a total delay corresponding to the first and second delays remains substantially constant despite transistor performance variation in either stage 114, 116 of the enable signal generator 112, e.g., as illustrated by Step 202 of FIG. 2. This way, the bit line sense amplifier circuitry 110 can accurately and reliably sense the array bit lines when enabled by the output (SA_EN) of the second enable signal generator stage 116, e.g., as illustrated by Step 204 of FIG. 2.

Figure 3:
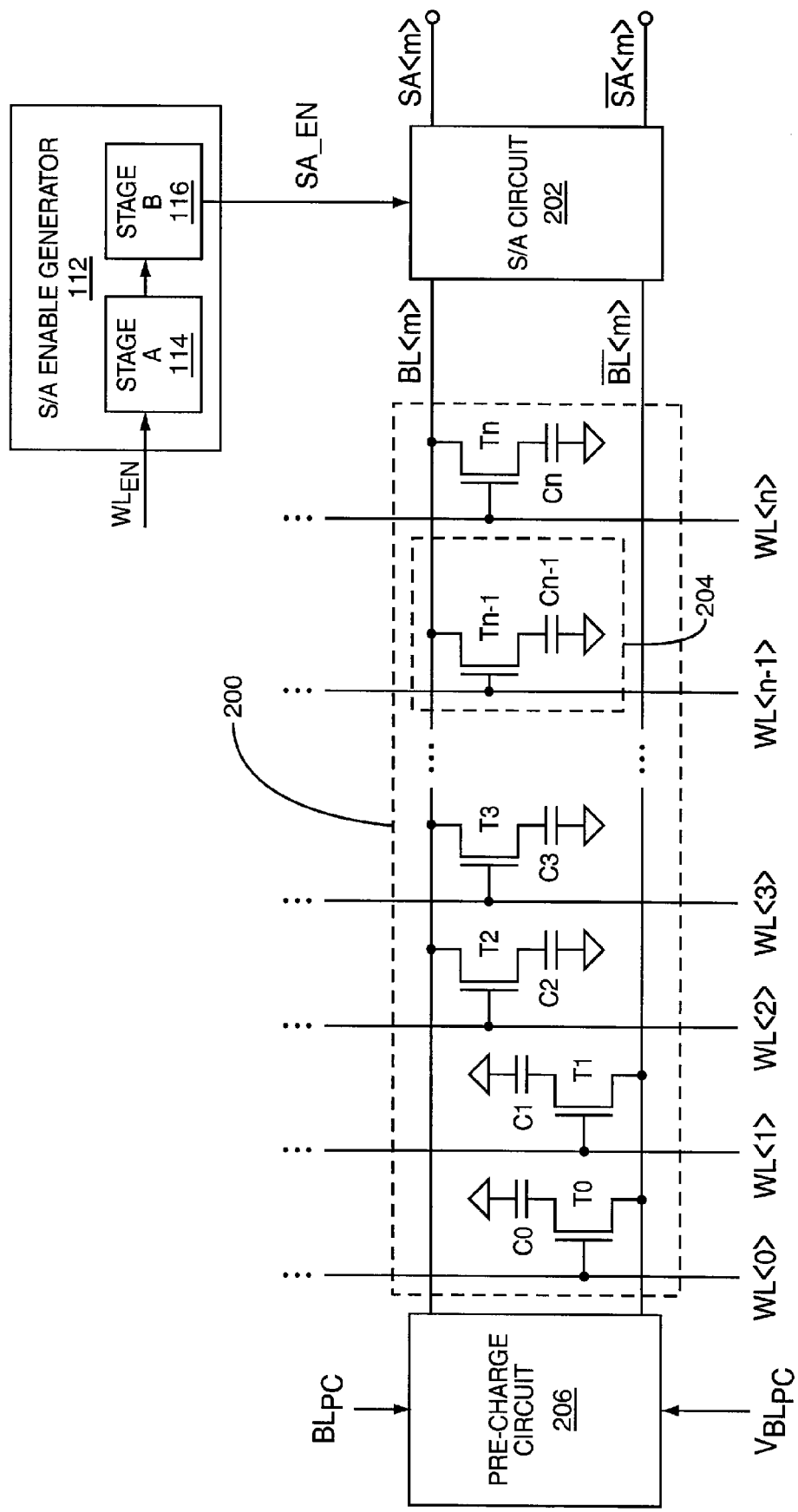
FIG. 3 is a block diagram of an embodiment of the bit line sense amplifier circuitry and enable signal generator of FIG. 1.

FIG. 3 illustrates an embodiment of the bit line sense amplifier circuitry 110 as controlled by the enable signal generator 112. According to this embodiment, each column 200 of the memory array 102 is coupled to a sense amplifier circuit 202. Operation of each sense amplifier circuit 202 is controlled by the enable signal generator 112. In one embodiment, the enable signal generator 112 globally controls operation of all sense amplifier circuits 202. In another embodiment, operation of each sense amplifier circuit 202 is controlled by a separate enable signal generator 112. Either way, the sense amplifier circuit 202 shown in FIG. 3 is coupled to the column 200 formed by the $m^{th}$ bit line (BL<m>) and an adjacent bit line ($\overline{BL}$<m>). Each bit line is coupled to a plurality of memory cells 204, each memory cell 204 having an access transistor (T0-Tn) and storage capacitor (C0-Cn).

At the beginning of a read or refresh operation, the sense amplifier circuit 202 is disabled by the enable signal generator 112 so that the signal levels on the array bit lines may be properly developed before sensing occurs. To this end, a row in the memory array 102 is selected at the beginning of a memory operation by activating the corresponding word line (WL<0:n>). For ease of explanation only, operation of the sense amplifier circuit 202 and enable signal generator 112 is described next with reference to the third word line (WL<2>) being activated. In response to the activation of WL<2>, access transistor T2 couples storage capacitor C2 to the $m^{th}$ bit line.

In one embodiment, operation of the first enable signal generator stage 114 is triggered in response to a signal ($WL_{EN}$) indicating WL<2> has been activated. The output of the first stage 114 activates in response to a first delay lapsing after WL<2> is activated. This in turn triggers operation of the second enable signal generator stage 116. The output (SA_EN) of the second stage 116 activates in response to a second delay lapsing after activation of the first stage output. The first and second stages 114, 116 are designed so that the total delay of the enable signal generator remains substantially constant despite transistor performance variation in either stage 114, 116.

The total delay of the enable signal generator 112 is selected so that each storage capacitor included in the memory array 102 can sufficiently share charge with their respective bit lines before bit line sensing commences. This way, the bit line signal levels are sufficiently developed before sensing is performed. In FIG. 3, the second stage 116 of the enable signal generator 112 enables the sense amplifier circuit 202 when the second stage output is activated. In response, the sense amplifier circuit 202 begins sensing the voltage difference between the m$^{th}$ bit line and the adjacent bit line. The sense amplifier circuit 202 amplifies the sensed voltage levels by driving the bit lines to opposing logic states corresponding to the voltage levels present on the bit lines before the sense amplifier circuit 202 is enabled. In the present example, storage capacitor C2 shares charge with the m$^{th}$ bit line when WL<2> is activated. The m$^{th}$ bit line is either charged slightly above or discharged slightly below its pre-charge level depending on the logic state of capacitor C2. The adjacent bit line remains charged at the pre-charge voltage level since no storage capacitor in that column is coupled to the bit line when WL<2> is active.

A pre-charge circuit 206 such as an equalizer charges/discharges the bit lines to the same pre-charge voltage level ($V_{BLPC}$) at the beginning of the memory operation in response to a control signal ($BL_{PC}$) provided by the control logic 122. This way, adjacent bit lines in the memory array 102 develop a slight voltage difference when a word line is activated because only one of two adjacent bit lines is coupled to a storage capacitor. The sense amplifier circuit 202 amplifies the voltage difference between the bit lines when enabled by the signal generator 112.

Figure 4:
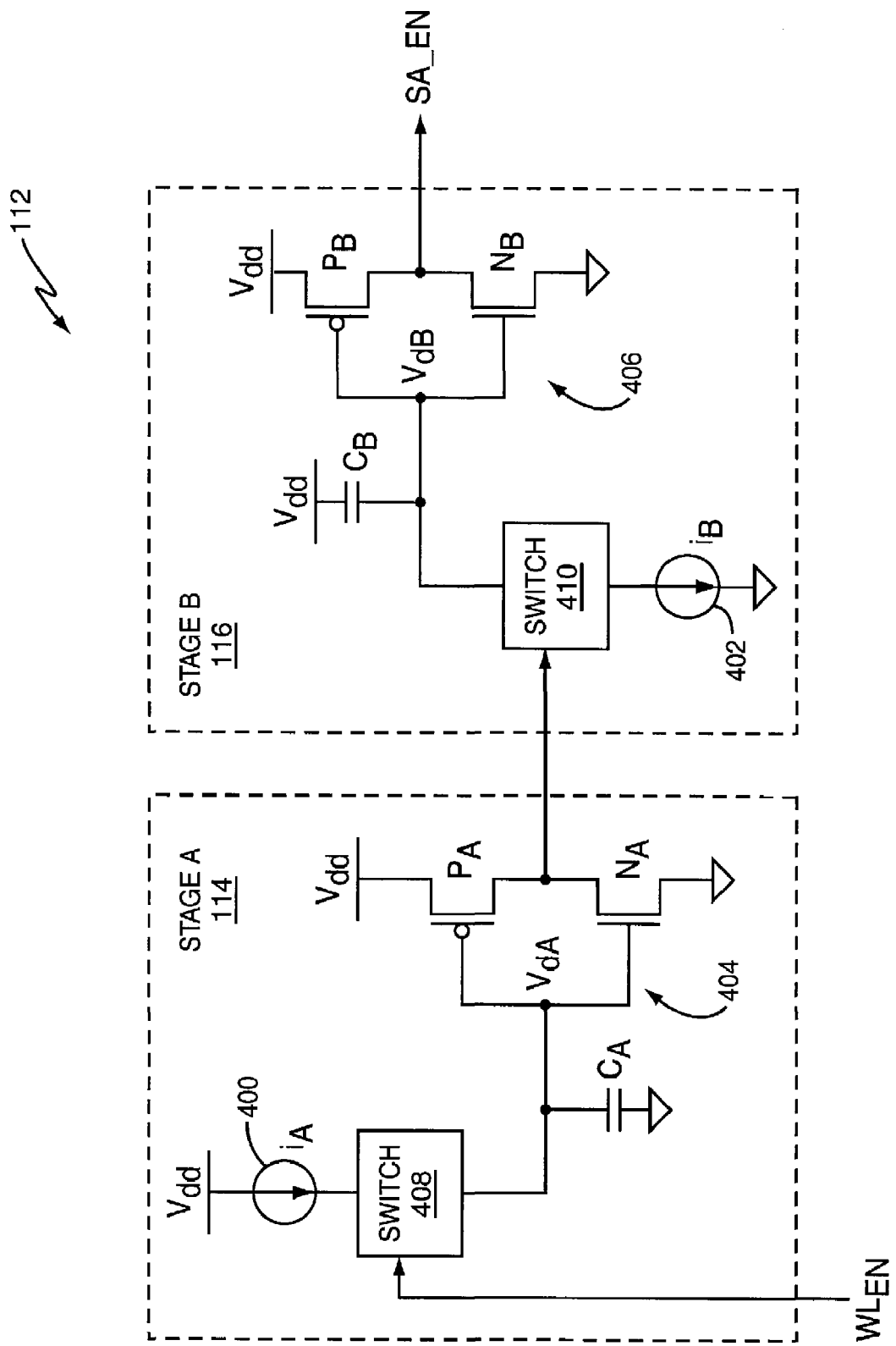
FIG. 4 is a block diagram of an embodiment of the enable signal generator of FIG. 1.

FIG. 4 illustrates an embodiment of the enable signal generator 112. According to this embodiment, each stage 114, 116 of the enable signal generator 112 includes a constant-current source 400, 402, an inverter 404, 406 and a switch 408, 410 for controllably coupling the constant-current sources 400, 402 to the inverters 404, 406. Operation of the first stage 114 is triggered when a word line is activated ($WL_{EN}$) during a memory operation. In response, the switch 408 included in the first stage 114 couples the first constant-current source 400 to the input of the first inverter 404. Before the first constant-current source 400 is coupled to the first inverter 404, the inverter input is discharged to ground (GND) by capacitor $C_A$. Thus, the first constant-current source 400 begins charging the inverter input from ground toward Vdd when coupled to the first inverter 404. The output of the first inverter 404 eventually activates by switching logic states (from a logic one to a logic zero in this embodiment).

The switching point ($V_{dA}$) of the first inverter 404 depends on how well transistor pair $P_A$ and $N_A$ is matched. When transistors $P_A$ and $N_A$ are substantially matched, $$V_{dA} \approx \frac{Vdd}{2}.$$

However, $$V_{dA} > \frac{Vdd}{2}$$

when p-fet transistor $P_A$ is stronger (i.e., faster) than n-fet transistor $N_A$. Contrarily, $$V_{dA} < \frac{Vdd}{2}$$

when p-fet transistor $P_A$ is weaker (i.e., slower) than n-fet transistor $N_A$. Thus, the delay $t_{dA}$ associated with the first stage 114 is a function of how well transistors $P_A$ and $N_A$ are matched as given by:

$$t_{dA} = \frac{C_A(V_{dA} - GND)}{i_A} \quad (1)$$

where $i_A$ is the current output by the first constant-current source 400. According to equation (1), the delay of the first stage 114 increases when p-fet transistor $P_A$ is stronger than n-fet transistor $N_A$ and decreases when $P_A$ is weaker than $N_A$.

Operation of the second stage 116 is similar to that of the first stage 144. The second stage 116 is triggered when the output of the first inverter 404 activates, i.e., changes state according to the present embodiment. In response, the switch 410 included in the second stage 116 couples the second constant-current source 402 to the input of the second inverter 406. Unlike the first stage 114, the input of the second inverter 406 is initially charged to Vdd by capacitor $C_B$ before the second constant-current source 402 is coupled thereto. Thus, the second constant-current source 402 begins discharging the inverter input from Vdd toward ground when coupled to the second inverter 406. The output (SA_EN) of the second inverter 406 eventually activates by changing logic states (from a logic zero to a logic one in this embodiment).

Like the first stage 114, the switching point ($V_{dB}$) of the second inverter 406 depends on how well transistor pair $P_B$ and $N_B$ is matched. When transistors $P_B$ and $N_B$ are substantially matched, $$V_{dB} \approx \frac{Vdd}{2}.$$

However, $$V_{dB} > \frac{Vdd}{2}$$

when p-fet transistor $P_B$ is stronger than n-fet transistor $N_B$. Contrarily, $$V_{dB} < \frac{Vdd}{2}$$

when p-fet transistor $P_B$ is weaker than n-fet transistor $N_B$. Thus, the delay $t_{dB}$ associated with the second stage 116 is a function of how well transistors $P_B$ and $N_B$ are matched as given by:

$$t_{dB} = \frac{C_B(V_{dd} - V_{dB})}{i_B} \quad (2)$$

where $i_B$ is the current output by the second constant-current source 402. According to equation (2), the delay of the second stage 116 decreases when p-fet transistor $P_B$ is stronger than n-fet transistor $N_B$ and increases when $P_B$ is weaker than $N_B$.

Each stage 114, 116 of the enable signal generator 112 contributes to the overall delay ($t_{dTOTAL}$) of the signal generator 112 as given by:

$$t_{dTOTAL} = t_{dA} + t_{dB} \quad (3)$$

The total delay of the signal generator 112 remains relatively constant despite transistor performance variations in either stage 114, 116 because $t_{dA}$ and $t_{dB}$ shift in opposing directions that counterbalance each other in response to the same type of transistor mismatch. As such, delay variation in one stage 114, 116 is offset by the delay variation in the other.

Particularly, the enable signal generator 112 delays activation of one inverter output by an amount corresponding to how early the other inverter output changes state before a nominal delay lapses. For example, if p-fet devices $P_A$ and $P_B$ and n-fet devices $N_A$ and $N_B$ are well matched, both stages 114, 116 have approximately the same nominal delay corresponding to $$\frac{Vdd}{2}.$$

However, if p-fet devices $P_A$ and $P_B$ are stronger than n-fet devices $N_A$ and $N_B$, the second stage 116 operates faster than the first stage 114 based on equations (1) and (2). As a result, the delay incurred by the second stage 116 is less than the nominal delay.

However, the first stage 114 counteracts the shift in the second stage delay by delaying activation of the output of the first inverter 404. The output of the first inverter 404 is delayed by an amount corresponding to how early the output of the second inverter 406 changes state before the nominal delay lapses. This way, delay shortfall of the second stage 116 is compensated for by increasing the first stage delay.

Similarly, the first stage 114 operates faster than the second stage 116 when p-fet devices $P_A$ and $P_B$ are weaker than n-fet devices $N_A$ and $N_B$. Based on equation (1), the delay of the first stage 114 is less than the nominal delay when this condition occurs. The second stage 116 counteracts this delay shift by delaying activation of the output of the second inverter 406 by an amount corresponding to how early the output of the first inverter 404 changes state before the nominal delay lapses. This way, the bit line signal development time of the memory device 100 is not violated or overly compensated when the enable signal generator 112 has transistor mismatches. The output signal of the enable signal generator 112 can be used to enable other types of circuitry such as, e.g., bias circuitry, clock signal generators, encoders, decoders, or any other type of circuitry having an enable signal input.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of generating an enable signal, comprising:
   activating an output of a first stage of an enable signal generator responsive to a first delay lapsing during a circuit operation;
   activating an output of a second stage of the enable signal generator responsive to a second delay lapsing after activation of the first stage output; and
   counteracting variation in either delay so that a total delay corresponding to the first and second delays remains substantially constant despite transistor performance variation in either stage of the enable signal generator.

2. The method of claim 1, wherein counteracting variation in either delay comprises increasing the delay associated with one of the stages by an amount corresponding to a decrease in the delay associated with the other stage.

3. The method of claim 1, wherein activating the first stage output responsive to the first delay lapsing comprises coupling a first current source to the input of a first inverter.

4. The method of claim 3, wherein activating the second stage output responsive to the second delay lapsing comprises coupling a second current source to the input of a second inverter responsive to the output of the first inverter.

5. The method of claim 4, wherein counteracting variation in either delay comprises delaying activation of one inverter output by an amount corresponding to how early the other inverter output changes state before a nominal delay lapses.

6. The method of claim 1, wherein activating the output of the first stage responsive to the first delay lapsing comprises activating the output of the first stage responsive to the first delay lapsing after activation of a memory device word line.

7. An enable signal generator, comprising:
   a first stage having an output configured to activate responsive to a first delay lapsing during a circuit operation;
   a second stage having an output configured to activate responsive to a second delay lapsing after activation of the first stage output; and
   wherein the first and second stage counteract delay variation so that a total delay corresponding to the first and second delays remains substantially constant despite transistor performance variation in either stage.

8. The enable signal generator of claim 7, wherein one of the stages is configured to increase the delay associated with that stage by an amount corresponding to a decrease in the delay associated with the other stage.

9. The enable signal generator of claim 7, wherein the first stage comprises a first inverter having an input coupled to a first current source responsive to the first delay lapsing.

10. The enable signal generator of claim 9, wherein the second stage comprises a second inverter having an input coupled to a second current source responsive to the output of the first inverter changing state.

11. The enable signal generator of claim 10, wherein the first stage is configured to delay activation of the output of the first inverter by an amount corresponding to how early the output of the second inverter changes state before a nominal delay lapses.

12. The enable signal generator of claim 10, wherein the second stage is configured to delay activation of the output of the second inverter by an amount corresponding to how early the output of the first inverter changes state before a nominal delay lapses.

13. The enable signal generator of claim 7, wherein the output of the first stage is configured to activate responsive to the first delay lapsing after activation of a memory device word line.

14. A method of sensing memory array content, comprising:
   activating an enable signal generator having first and second stages during a memory operation;
   counteracting delay variation in either stage of the enable signal generator so that operation of the enable signal generator is substantially unaffected by transistor performance variation in either stage; and
   enabling sense amplifier circuitry coupled to one or more memory cells responsive to a signal output by the enable signal generator.

15. The method of claim 14, wherein counteracting delay variation in either stage of the enable signal generator comprises increasing a delay associated with one of the stages by an amount corresponding to a decrease in a delay associated with the other stage.

16. The method of claim 14, wherein activating the enable signal generator comprises:
coupling a first current source to the input of a first inverter responsive to a first delay lapsing during the memory operation; and
coupling a second current source to the input of a second inverter responsive to a second delay lapsing after the output of the first inverter switches state.

17. The method of claim 16, wherein counteracting delay variation in either stage of the enable signal generator comprises delaying activation of one inverter output by an amount corresponding to how early the other inverter output changes state before a nominal delay lapses.

18. A memory device comprising:
a plurality of memory cells;
sense amplifier circuitry coupled to one or more of the memory cells and configured to sense the state of the one or more memory cells when enabled; and
an enable signal generator having first and second stages, the enable signal generator configured to generate an enable signal applied to the sense amplifier circuitry and to counteract delay variation when generating the enable signal so that operation of the enable signal generator is substantially unaffected by transistor performance variation in either stage of the enable signal generator.

19. The memory device of claim 18, wherein the enable signal generator is configured to increase a delay associated with one of the stages by an amount corresponding to a decrease in a delay associated with the other stage.

20. The memory device of claim 18, wherein the enable signal generator is configured to couple a first current source to the input of a first inverter responsive to a first delay lapsing and to couple a second current source to the input of a second inverter responsive to the output of the first inverter switching state.

21. The memory device of claim 20, wherein the enable signal generator is configured to delay activation of one of the inverter outputs by an amount corresponding to how early the other inverter output changes state before a nominal delay lapses.

22. A memory device comprising:
a plurality of memory cells;
sense amplifier circuitry coupled to one or more of the memory cells and configured to sense the state of the one or more memory cells when enabled; and
means for generating an enable signal applied to the sense amplifier circuitry and for counteracting delay variation when generating the enable signal so that generation of the enable signal is substantially unaffected by transistor performance variation in the memory device.

* * * * *